(12) United States Patent
Kim et al.

(10) Patent No.: US 11,411,287 B2
(45) Date of Patent: Aug. 9, 2022

(54) THREE-ELECTRODE-SYSTEM-TYPE ELECTRODE POTENTIAL MEASUREMENT DEVICE INCLUDING SHORT-CIRCUIT PREVENTION MEMBER

(71) Applicant: LG Chem, Ltd., Seoul (KR)

(72) Inventors: Min-Gyu Kim, Daejeon (KR); Joo-Hwan Sung, Daejeon (KR)

(73) Assignee: LG Energy Solution, Ltd.

( * ) Notice: Subject to any disclaimer, the term of this patent is extended or adjusted under 35 U.S.C. 154(b) by 800 days.

(21) Appl. No.: 16/338,601

(22) PCT Filed: Dec. 21, 2017

(86) PCT No.: PCT/KR2017/015187
§ 371 (c)(1),
(2) Date: Apr. 1, 2019

(87) PCT Pub. No.: WO2018/131822
PCT Pub. Date: Jul. 19, 2018

(65) Prior Publication Data
US 2019/0237738 A1    Aug. 1, 2019

(30) Foreign Application Priority Data
Jan. 11, 2017 (KR) .................. 10-2017-0004098

(51) Int. Cl.
*H01M 50/54* (2021.01)
*H01M 10/48* (2006.01)
(Continued)

(52) U.S. Cl.
CPC .......... *H01M 50/54* (2021.01); *G01R 31/36* (2013.01); *G01R 31/364* (2019.01);
(Continued)

(58) Field of Classification Search
None
See application file for complete search history.

(56) References Cited

U.S. PATENT DOCUMENTS 6,284,408 B1    9/2001 Akazawa et al.
8,163,410 B2    4/2012 Fulop et al.
(Continued)

FOREIGN PATENT DOCUMENTS

| CN | 1242613 A | 1/2000 |
| CN | 1635647 A | 7/2005 |

(Continued)

OTHER PUBLICATIONS

International Search Report for PCT/KR2017/015187 dated Apr. 19, 2018.
(Continued)

*Primary Examiner* — Roy Y Yi
(74) *Attorney, Agent, or Firm* — Lerner, David, Littenberg, Krumholz & Mentlik, LLP

(57) ABSTRACT

Disclosed herein is a three-electrode-system-type electrode potential measurement device for measuring the electrode potential of a cylindrical battery cell in which a beading portion is in a divided condition, the beading portion provided between a top cap assembly and a battery case, a first electrode terminal of the cylindrical battery cell located at the top cap assembly, and a second electrode terminal of the cylindrical battery cell located at the battery case, the electrode potential measurement device including a working electrode connection unit connected to one of the first electrode terminal or the second electrode terminal; a counter electrode connection unit connected to the other of the first electrode terminal or the second electrode terminal; a reference electrode connection unit connected to a reference electrode; a measurement unit connected to the working electrode connection unit; and a short-circuit prevention
(Continued)

member located between the top cap assembly and the battery case.

14 Claims, 3 Drawing Sheets

(51) Int. Cl.
    *G01R 31/364* (2019.01)
    *G01R 31/36* (2020.01)
    *H01M 50/10* (2021.01)
    *H01M 50/15* (2021.01)
    *H01M 50/60* (2021.01)
    *H01M 50/147* (2021.01)
    *H01M 50/531* (2021.01)
    *H01M 50/538* (2021.01)
    *H01M 50/636* (2021.01)

(52) U.S. Cl.
    CPC ........ *G01R 31/3644* (2013.01); *H01M 10/48* (2013.01); *H01M 50/10* (2021.01); *H01M 50/147* (2021.01); *H01M 50/15* (2021.01); *H01M 50/531* (2021.01); *H01M 50/538* (2021.01); *H01M 50/60* (2021.01); *H01M 50/636* (2021.01)

(56) References Cited

U.S. PATENT DOCUMENTS

| | | |
|---|---|---|
| 8,541,122 B2 | 9/2013 | Fulop et al. |
| 9,874,592 B2 | 1/2018 | Nakai |
| 2005/0260489 A1 | 11/2005 | Kim |
| 2006/0257729 A1 | 11/2006 | Lee |
| 2008/0186030 A1 | 8/2008 | Kasamatsu et al. |
| 2009/0029240 A1 | 1/2009 | Gardner et al. |
| 2009/0104510 A1 | 4/2009 | Fulop et al. |
| 2009/0305122 A1 | 12/2009 | Mitani et al. |
| 2012/0263986 A1 | 10/2012 | Fulop et al. |
| 2013/0316209 A1 | 11/2013 | Masumoto et al. |
| 2014/0023888 A1 | 1/2014 | Fulop et al. |
| 2016/0061874 A1 | 3/2016 | Nakai |
| 2016/0336567 A1 | 11/2016 | Vigneras |

FOREIGN PATENT DOCUMENTS

| | | |
|---|---|---|
| CN | 1700496 A | 11/2005 |
| CN | 1855599 A | 11/2006 |
| CN | 101276943 A | 10/2008 |
| CN | 101442135 A | 5/2009 |
| CN | 101599555 A | 12/2009 |
| CN | 101816093 A | 8/2010 |
| CN | 103370815 A | 10/2013 |
| CN | 106058302 A | 10/2016 |
| CN | 106252561 A | 12/2016 |
| JP | 2004363091 A | 12/2004 |
| JP | 2010539657 A | 12/2010 |
| JP | 4701450 B2 | 6/2011 |
| KR | 20060085444 A | 7/2006 |
| KR | 100838164 B1 | 6/2008 |
| KR | 20080049544 A | 6/2008 |
| KR | 101023352 B1 | 3/2011 |
| KR | 20130042912 A | 4/2013 |
| KR | 20130128030 A | 11/2013 |
| KR | 101405770 B1 | 6/2014 |
| KR | 20160015778 A | 2/2016 |
| KR | 20160039474 A | 4/2016 |
| KR | 20160076030 A | 6/2016 |
| KR | 101655871 B1 | 9/2016 |
| WO | 2014167710 A1 | 10/2014 |

OTHER PUBLICATIONS

Search Report from Chinese Office Action for Application No. 201780053726.3 dated Jul. 31, 2020; 2 pages.

[Fig.1]
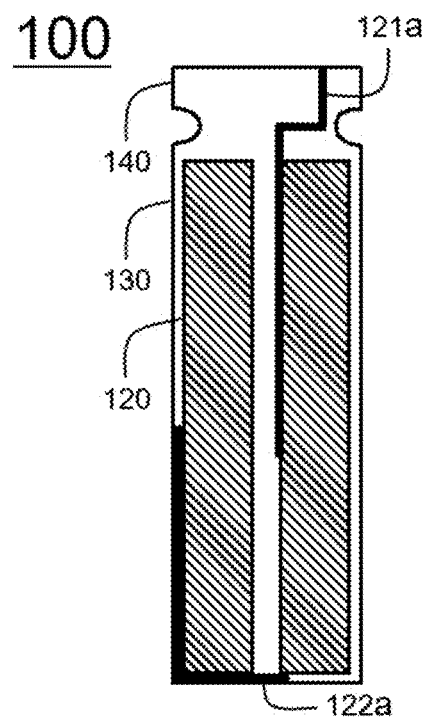
[Fig.2]
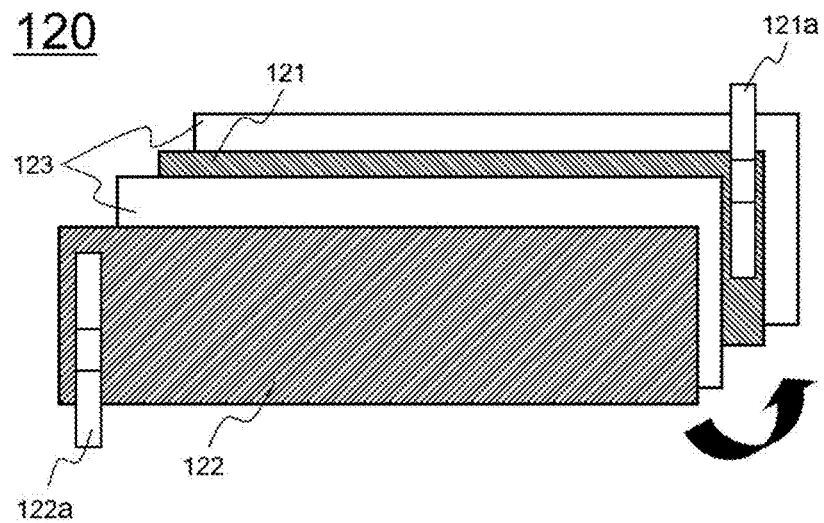

[Fig.3]
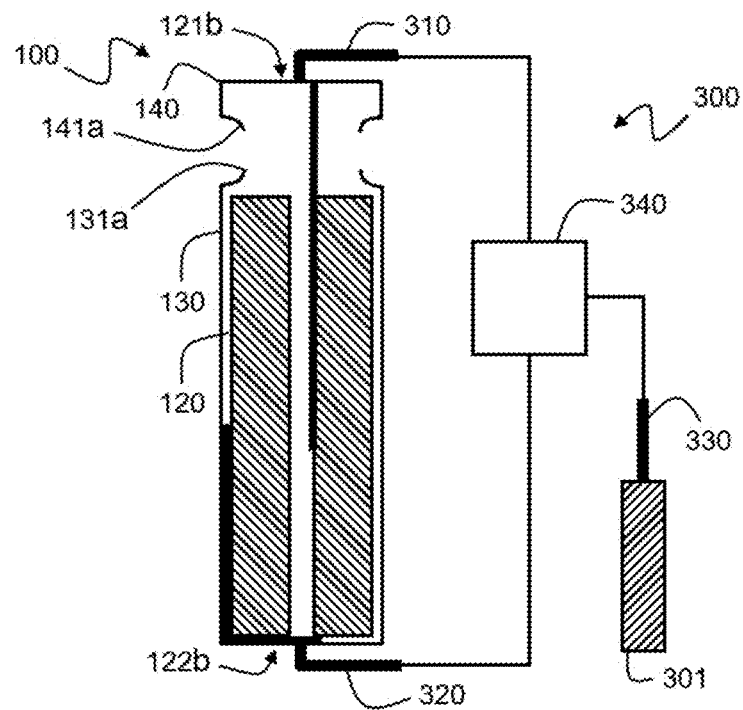
[Fig.4]
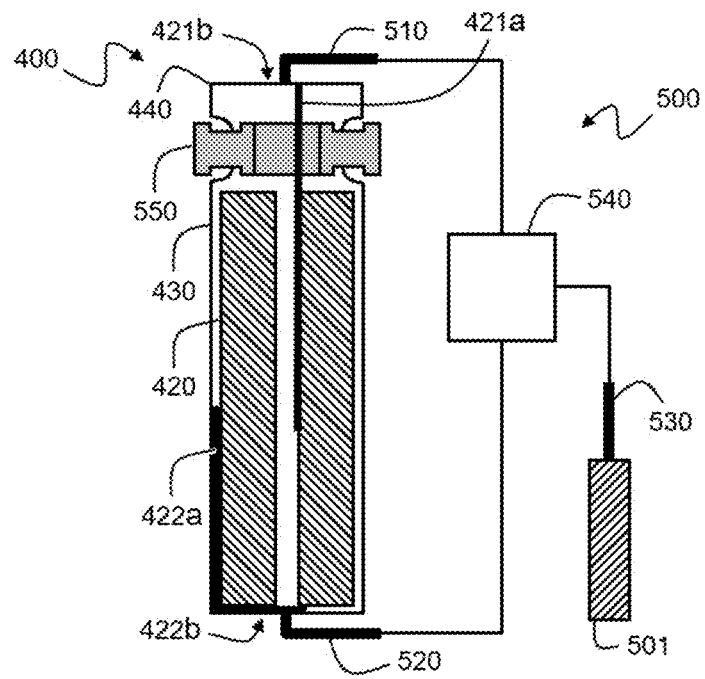

[Fig.5]
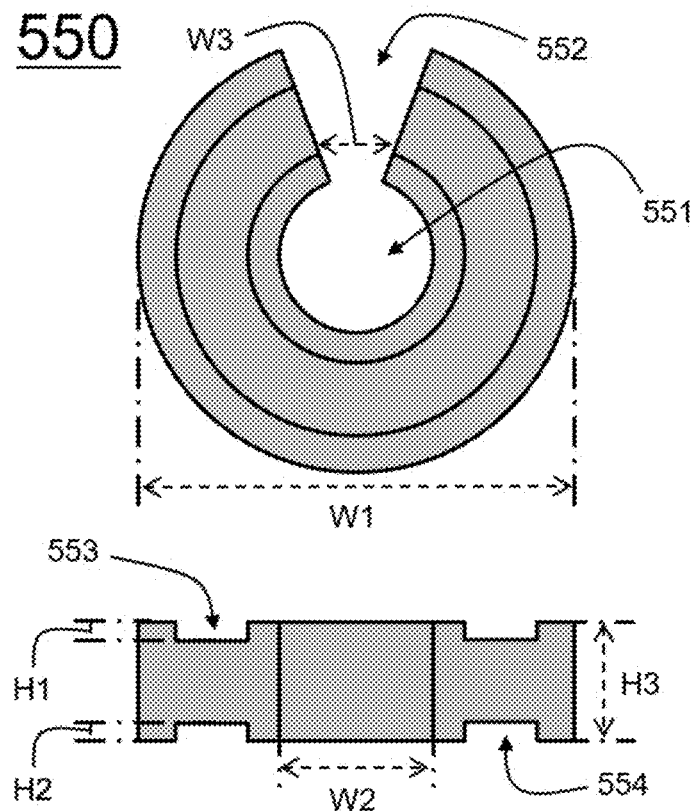
[Fig.6]
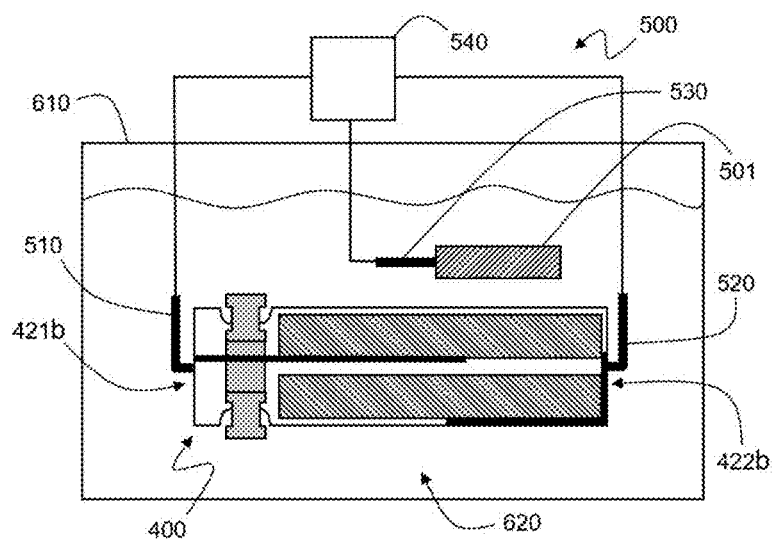

THREE-ELECTRODE-SYSTEM-TYPE ELECTRODE POTENTIAL MEASUREMENT DEVICE INCLUDING SHORT-CIRCUIT PREVENTION MEMBER

CROSS-REFERENCE TO RELATED APPLICATIONS

This application is a national phase entry under 35 U.S.C. § 371 of International Application No. PCT/KR2017/015187, filed on Dec. 21, 2017, published in Korean, which claims priority from Korean Patent Application No. 10-2017-0004098, filed on Jan. 11, 2017, the disclosures of which are incorporated herein by reference.

TECHNICAL FIELD

The present invention relates to a three-electrode-system-type electrode potential measurement device including a short-circuit prevention member.

BACKGROUND ART

As energy prices are increasing due to the depletion of fossil fuels and increasing attention is being paid to environmental pollution, the demand for environmentally friendly alternative energy sources is bound to play an increasing role in the future. Thus, research into techniques for generating various kinds of power, such as nuclear energy, solar energy, wind energy, and tidal power, is underway, and power storage apparatuses for more efficient use of such generated energy are also drawing a lot of attention.

In particular, as mobile devices have been increasingly developed and the demand for such mobile devices has increased, the demand for secondary batteries as energy sources for such mobile devices has also sharply increased. Accordingly, a lot of research on batteries that are capable of satisfying various needs has been carried out.

Typically, in terms of the shape of batteries, the demand for prismatic secondary batteries or pouch-shaped secondary batteries that are thin enough to be applied to products such as cellular phones is very high. In terms of the material for batteries, on the other hand, the demand for lithium secondary batteries, such as lithium ion batteries or lithium ion polymer batteries, which exhibit high energy density, discharge voltage, and output stability, is also very high.

In addition, secondary batteries may be classified based on the structure of an electrode assembly, which has a structure in which a positive electrode and a negative electrode are stacked in the state in which a separator is interposed between the positive electrode and the negative electrode. Typically, the electrode assembly may be configured to have a jelly-roll (wound) type structure in which a long sheet type positive electrode and a long sheet type negative electrode are wound in the state in which a separator is disposed between the positive electrode and the negative electrode, or a stacked type structure in which a plurality of positive electrodes and a plurality of negative electrodes, each of which has a predetermined size, are sequentially stacked in the state in which a plurality of separators is disposed respectively between the positive electrodes and the negative electrodes. In recent years, in order to solve problems with the jelly-roll type electrode assembly and the stacked type electrode assembly, there has been developed a stacked/folded type electrode assembly, which is a combination of the jelly roll type electrode assembly and the stacked type electrode assembly, having an improved structure in which a predetermined number of positive electrodes and a predetermined number of negative electrodes are sequentially stacked in the state in which a predetermined number of separators are disposed respectively between the positive electrodes and the negative electrodes to constitute a unit cell, after which a plurality of unit cells is sequentially folded in the state of being placed on a separation film.

In addition, secondary batteries may be classified based on the shape of a battery case of each of the secondary batteries into a cylindrical battery, configured to have a structure in which an electrode assembly is mounted in a cylindrical metal can, a prismatic battery, configured to have a structure in which an electrode assembly is mounted in a prismatic metal can, and a pouch-shaped battery, configured to have a structure in which an electrode assembly is mounted in a pouch-shaped case made of a laminated aluminum sheet.

FIG. 1 is a schematic view showing the structure of a cylindrical battery cell, and FIG. 2 is a schematic view showing the structure of an electrode assembly constituting the cylindrical battery cell of FIG. 1 before the electrode assembly is wound.

Referring to FIGS. 1 and 2, the cylindrical battery cell, which is denoted by reference numeral 100, is manufactured by placing a wound type electrode assembly 120 in a cylindrical battery case 130, injecting an electrolytic solution into the battery case 130, and coupling a top cap assembly 140, at which an electrode terminal is formed, to the open upper end of the battery case 130.

The electrode assembly 120 is manufactured by sequentially stacking a positive electrode 121, a negative electrode 122, and a separator 123 and winding the stack into a circle in the direction indicated by the arrow.

The positive electrode 121 and the negative electrode 122 of the electrode assembly 120 include a positive electrode tab 121a and a negative electrode tab 122a, respectively, each of which is attached to one surface of a corresponding one of the positive electrode 121 and the negative electrode 122. The positive electrode tab 121a and the negative electrode tab 122a protrude in opposite directions.

In the case in which the electrode assembly 120 is mounted in the battery case 130, therefore, the positive electrode tab 121a and the negative electrode tab 122a protrude in opposite directions. Specifically, the positive electrode tab 121a is connected to the top cap assembly 140, which is coupled to the open one surface of the battery case 130, in the state of protruding outwards from the open one surface of the battery case 130. As a result, a portion of the top cap assembly 140 serves as a positive electrode terminal.

The negative electrode tab 122a protrudes to the lower surface of the battery case 130, which is opposite the open one surface of the battery case 130, so as to be coupled to the inner surface of the battery case 130. As a result, the battery case 130 itself serves as a negative electrode terminal.

Meanwhile, in order to test the performance of a battery cell that has been newly developed and manufactured, a process of measuring the electrode potential of the battery cell is performed.

A three-electrode-system-type electrode potential measurement device including a reference electrode, a working electrode, and an auxiliary electrode is mainly used for electrode potential measurement.

FIG. 3 is a schematic view showing the structure of a three-electrode-system-type electrode potential measurement device for measuring the electrode potential of the cylindrical battery cell of FIG. 1.

Referring to FIG. 3 together with FIG. 1, a beading portion, which is disposed between the top cap assembly 140 and the battery case 130 of the battery cell 100, is divided, and a three-electrode-system-type electrode potential measurement device 300 is connected to a positive electrode terminal 121b, which is located at the top cap assembly 140 of the battery cell 100, and to a negative electrode terminal 122b, which is located at the battery case 130.

Specifically, a working electrode connection unit 310 is connected to the positive electrode terminal 121b in order to measure the electrode potential of the positive electrode terminal 121b, and a counter electrode connection unit 320 is connected to the negative electrode terminal 122b, which is located at the battery case 130.

A reference electrode connection unit 330 is connected to a reference electrode 301, which forms a battery circuit for electrode potential measurement.

The reference electrode 301 is an electrode that is used to form a battery circuit for electrode potential measurement together with an electrode constituting a battery or an electrode that is being electrolyzed in order to measure the potential of the electrode. The relative value of the electrode potential is measured based on the potential of the reference electrode.

The working electrode connection unit 310, the counter electrode connection unit 320, and the reference electrode connection unit 330 are connected to a measurement unit 340. The measurement unit 340 measures the electrode potential of the positive electrode terminal 121b through the three-electrode system.

In the case in which the end 141a of the top cap assembly 140 and the end 131a of the battery case 130 come into contact with each other during the above process, however, a short circuit may occur in the battery cell, whereby the chemical properties or performance of the electrode assembly 120 may be changed. As a result, it is not possible to accurately measure the electrode potential.

In addition, flames or scattering objects generated due to such a short circuit that occurs in the battery cell may act as a dangerous factor that reduces the safety of a worker. As a result, the measurement of the electrode potential using the three-electrode system is very difficult.

Particularly, in the case in which the electrode potential of the battery cell 100 is measured using the three-electrode system, it is very difficult to constitute a circuit due to the above problems. In addition, it takes a lot of time to separate the top cap assembly 140 and the battery case 130 from each other and to fix the top cap assembly 140 and the battery case 130 in order to solve the above problems. As a result, the measurement of the electrode potential of the battery cell 100 is delayed.

Therefore, there is an urgent necessity for technology that is capable of fundamentally solving the above problems.

DISCLOSURE

Technical Problem

The present invention has been made to solve the above problems and other technical problems that have yet to be resolved.

As a result of a variety of extensive and intensive studies and experiments to solve the problems described above, the inventors of the present application have found that, in the case in which an electrode potential measurement device includes a short-circuit prevention member located between a top cap assembly and a battery case, between which a beading portion is divided, in the state of being in contact with the top cap assembly and the battery case, as will be described below, it is possible to prevent the occurrence of a short circuit in a battery cell due to direct contact between the top cap assembly and the battery, at which electrode terminals having different polarities are located, and to prevent a reduction in the properties or performance of an electrode assembly due to the same, whereby it is possible to more accurately measure the electrode potential of the battery cell and thus to improve the reliability of measurement, and, at the same time, it is possible to effectively prevent a reduction in the safety of a worker due to flames or scattering objects generated when a short circuit occurs in the battery cell, and it is also possible to reduce time and expense incurred to separate the top cap assembly and the battery case from each other and to fix the top cap assembly and the battery case, since the electrode potential of the battery cell can be reliably measured in the state in which only the short-circuit prevention member is interposed between the top cap assembly and the battery case. The present invention has been completed based on these findings.

Technical Solution

In accordance with an aspect of the present invention, the above and other objects can be accomplished by the provision of a three-electrode-system-type electrode potential measurement device for measuring the electrode potential of a cylindrical battery cell in a state in which a beading portion is in a divided condition, the beading portion being provided between a top cap assembly and a battery case, a first electrode terminal of the cylindrical battery cell being located at the top cap assembly, and a second electrode terminal of the cylindrical battery cell being located at the battery case, the electrode potential measurement device including a working electrode connection unit connected to a first one of the first electrode terminal or the second electrode terminal for measuring the electrode potential of the first electrode terminal or the second electrode terminal, a counter electrode connection unit connected to a remaining one of the first electrode terminal or the second electrode terminal that is not connected to the working electrode connection unit, a reference electrode connection unit connected to a reference electrode, the reference electrode connection unit, the working electrode connection unit, and the counter electrode connection unit together forming a battery circuit for electrode potential measurement, for measuring a relative value of a potential of the first one of the first electrode terminal or the second electrode terminal connected to the working electrode connection unit, a measurement unit connected to the working electrode connection unit, the counter electrode connection unit, and the reference electrode connection unit, the first measurement unit being configured to measure the potential of the first one of the first electrode terminal or the second electrode terminal connected to the working electrode connection unit, and a short-circuit prevention member located between the top cap assembly and the battery case, between which the beading portion is divided, the short-circuit prevention member disposed in the state of being in contact with the top cap assembly and the battery case for preventing the occurrence of a short circuit due to contact between the top cap assembly and the battery case of the cylindrical battery cell.

Consequently, it is possible to prevent the occurrence of a short circuit in a battery cell due to direct contact between the top cap assembly and the battery, at which electrode terminals having different polarities are located, and to prevent a reduction in the properties or performance of an electrode assembly due to the same, whereby it is possible to more accurately measure the electrode potential of the battery cell and thus to improve the reliability of measurement. At the same time, it is possible to effectively prevent a reduction in the safety of a worker due to flames or scattering objects generated when a short circuit occurs in the battery cell, and it is also possible to reduce time and expense incurred to separate the top cap assembly and the battery case from each other and to fix the top cap assembly and the battery case, since the electrode potential of the battery cell can be reliably measured in the state in which only the short-circuit prevention member is interposed between the top cap assembly and the battery case.

In a concrete example, an electrode assembly may be mounted in the battery case in the state of being impregnated with an electrolytic solution, and the top cap assembly and the battery case may be electrically connected to a first electrode and a second electrode of the electrode assembly, respectively, via a first electrode tab and a second electrode tab, respectively, in order to form the first electrode terminal and the second electrode terminal, respectively.

That is, in the battery cell, the beading portion provided between the top cap assembly and the battery case is divided, but electrical connection between the electrode assembly, which is located in the battery case, and the top cap assembly and between the electrode assembly and the battery case via the electrode tabs is not released. In the case in which the working electrode connection unit and the counter electrode connection unit are connected respectively to the electrode terminals located at the top cap assembly and the battery case, therefore, the working electrode connection unit and the counter electrode connection unit are electrically connected to the electrode assembly, whereby a circuit may be constituted. As a result, it is possible to more easily and accurately measure the electrode potential of the battery cell.

In addition, the short-circuit prevention member may be made of a material that does not react with an electrolytic solution.

As previously described, the short-circuit prevention member mat be located between the top cap assembly and the battery case, between which the beading portion is divided, in the state of being in contact with the top cap assembly and the battery case in order to prevent the occurrence of a short circuit due to contact between the top cap assembly and the battery case of the cylindrical battery cell.

If the short-circuit prevention member reacts with the electrolytic solution, the short-circuit prevention member may be deformed or damaged by the electrolytic solution contained in the battery case even in the case in which the short-circuit prevention member is interposed between the top cap assembly and the battery case, between which the beading portion is divided. Consequently, the top cap assembly and the battery case may come into direct contact with each other, which causes a short circuit in the battery cell. As a result, desired effects may not be exhibited.

Consequently, the short-circuit prevention member is made of a material that does not react with the electrolytic solution. In this case, it is possible to prevent deformation of the short-circuit prevention member or damage to the short-circuit prevention member due to the electrolytic solution, whereby it is possible to effectively prevent the occurrence of a short circuit in the battery cell due to contact between the top cap assembly and the battery case during the process of measuring the electrode potential of the battery cell.

Here, the material that is used to form the short-circuit prevention member is not particularly restricted as long as the short-circuit prevention member is made of a material that does not react with the electrolytic solution while exhibiting desired structural stability. Specifically, the short-circuit prevention member may be made of a Teflon material in consideration of cost-effectiveness and ease in handling.

Meanwhile, the short-circuit prevention member may be configured to have a discontinuous circular structure when viewed in a plan view.

Consequently, the short-circuit prevention member may be configured to have a structure in which the planar shape of the short-circuit prevention member corresponds to the horizontal sectional shape of the top cap assembly and the battery case of the cylindrical battery cell, whereby one surface and the other surface of the short-circuit prevention member may maximally contact the ends of the top cap assembly and the battery case between the top cap assembly and the battery case. As a result, it is possible to easily prevent the occurrence of a short circuit in the battery cell due to contact between the top cap assembly and the battery case.

In this case, the diameter of the short-circuit prevention member may be 110% to 150% of the diameter of each of the top cap assembly and the battery case when viewed in a horizontal sectional view.

In the case in which the diameter of the short-circuit prevention member is less than 110% of the diameter of each of the top cap assembly and the battery case when viewed in a horizontal sectional view, the planar size of the short-circuit prevention member is too small, whereby the state of isolation between the top cap assembly and the battery case may not be stably maintained.

In the case in which the diameter of the short-circuit prevention member is greater than 150% of the diameter of each of the top cap assembly and the battery case when viewed in a horizontal sectional view, on the other hand, the planar size of the short-circuit prevention member is too large, whereby it is not easy to handle the short-circuit prevention member. In addition, the size of an unnecessary portion of the short-circuit prevention member is increased, whereby expense incurred to manufacture the electrode potential measurement device, including the short-circuit prevention member, may be increased.

In addition, the thickness of the short-circuit prevention member may be 50% to 150% of the height of the top cap assembly.

In the case in which the thickness of the short-circuit prevention member deviates from the above range and is too small, the state of isolation between the top cap assembly and the battery case may not be stably maintained. In the case in which the thickness of the short-circuit prevention member deviates from the above range and is too large, on the other hand, the size of the short-circuit prevention member is excessively increased, whereby it is not easy to handle the short-circuit prevention member. In addition, the electrode tab interconnecting the top cap assembly and the electrode assembly may be divided or cut, whereby it may not be possible to constitute a circuit for electrode potential measurement.

In a concrete example, the short-circuit prevention member may include an electrode tab through-hole formed through a central portion of the short-circuit prevention member when viewed in the plan view, such that a first electrode tab for electrically connecting the electrode assembly and the top cap assembly to each other is located in the electrode tab through-hole, and an electrode tab insertion part formed in a discontinuous portion of the short-circuit prevention member, the electrode tab insertion part being configured to receive the first electrode tab therethrough during assembly of the first electrode tab into the electrode tab through-hole.

Consequently, the short-circuit prevention member may be easily located between the top cap assembly and the battery case without division or cutting of the first electrode tab, which electrically connects the electrode assembly and the top cap assembly to each other.

The diameter of the electrode tab through-hole may be 10% to 90% of the diameter of the short-circuit prevention member.

In the case in which the diameter of the electrode tab through-hole is less than 10% of the diameter of the short-circuit prevention member, the diameter of the electrode tab through-hole is too small, whereby the first electrode tab, which electrically connects the electrode assembly and the top cap assembly to each other, may not be easily located in the electrode tab through-hole, or the first electrode tab may be deformed or damaged.

In the case in which the diameter of the electrode tab through-hole is greater than 90% of the diameter of the short-circuit prevention member, on the other hand, the size of the electrode tab through-hole is excessively increased, whereby the area of one surface and the other surface of the short-circuit prevention member for contact with the ends of the top cap assembly and the battery case that are separated from the beading portion may not be sufficient. As a result, the electrode tab through-hole, rather than one surface and the other surface of the short-circuit prevention member, may be located between the ends of the top cap assembly and the battery case that are separated from the beading portion, whereby it is not possible for the short-circuit prevention member to reliably prevent direct contact between the ends of the top cap assembly and the battery case.

In addition, the width of the electrode tab insertion part may be 10% to 50% of the width of the short-circuit prevention member when viewed in a plan view.

Here, the width of the electrode tab insertion part and the width of the short-circuit prevention member mean widths when viewed in a plan view.

In the case in which the width of the electrode tab insertion part is less than 10% of the width of the short-circuit prevention member, the width of the electrode tab insertion part is too small, whereby the first electrode tab, which electrically connects the electrode assembly and the top cap assembly to each other, may not be easily inserted into the electrode tab insertion part.

In the case in which the width of the electrode tab insertion part is greater than 50% of the width of the short-circuit prevention member, on the other hand, the width of the electrode tab insertion part is too large, whereby the first electrode tab may not be easily separated from the short-circuit prevention member through the electrode tab insertion part. As a result, the short-circuit prevention member may not be stably fixed by the first electrode tab located in the electrode tab through-hole, and therefore the short-circuit prevention member may be moved from its intended position between the top cap assembly and the battery case. Consequently, it becomes impossible to prevent contact between the top cap assembly and the battery case, whereby it is not possible to reliably prevent the occurrence of a short circuit in the battery cell.

Meanwhile, the short-circuit prevention member may define a first location groove and a second location groove, each of which is recessed inwards relative to respective first and second opposite surfaces of the short-circuit prevention member, the first and second surfaces contacting the top cap assembly and the battery case, respectively, such that ends of the top cap assembly and the battery case are located in the first location groove and the second location groove, respectively.

Consequently, the separated ends of the top cap assembly and the battery case may remain stably located in the first location groove and the second location groove, which are formed in one surface and the other surface of the short-circuit prevention member, respectively, whereby it is possible to effectively prevent the occurrence of a short circuit in the battery cell due to the separation of the short-circuit prevention member and contact between the top cap assembly and the battery case.

In this case, the sum of the depths of the first location groove and the second location groove may be 10 to 90% of the thickness of the short-circuit prevention member.

In the case in which the sum of the depths of the first location groove and the second location groove is less than 10% of the thickness of the short-circuit prevention member, the depths of the location grooves are too small, whereby it may not be possible to effectively prevent the occurrence of a short circuit in the battery cell due to the separation of the short-circuit prevention member and contact between the top cap assembly and the battery case.

In the case in which the sum of the depths of the first location groove and the second location groove is greater than 90% of the thickness of the short-circuit prevention member, on the other hand, the thickness of the portion of the short-circuit prevention member between the first location groove and the second location groove is too small, whereby the portion of short-circuit prevention member between the first location groove and the second location groove may be damaged due to contact between the ends of the top cap assembly and the battery case and due to the movement of the ends of the top cap assembly and the battery case. As a result, a short circuit may occur in the battery cell due to contact between the ends of the top cap assembly and the battery case at the portion of the short-circuit prevention member between the first location groove and the second location groove.

In addition, the first location groove and the second location groove may have the same depth or different depths, and the depth of each of the first location groove and the second location groove may be appropriately adjusted based on various factors, such as the size of each of the top cap assembly and the battery case and the length of the first electrode tab.

In accordance with another aspect of the present invention, there is provided a method of measuring the electrode potential of a cylindrical battery cell using an electrode potential measurement device, the method including a) cutting a beading portion of the cylindrical battery cell in order to separate a top cap assembly and a battery case of the cylindrical battery cell from each other, thereby causing the cylindrical battery cell to be in a divided state, b) locating a short-circuit prevention member between the top cap assembly and the battery case in order to prevent the occurrence of a short circuit by preventing contact between the top cap assembly and the battery case, c) connecting a working electrode connection unit of the electrode potential measurement device to a first one of a first electrode terminal located at the top cap assembly or a second electrode terminal located at the battery case, in order to measure a potential of the first one of the electrode terminals that is connected to the working electrode connection unit, d) connecting a counter electrode connection unit of the electrode potential measurement device to a remaining one of the first electrode terminal or the second electrode terminal that is not connected to the working electrode connection unit, e) connecting a reference electrode connection unit of the electrode potential measurement device to a reference electrode, and f) soaking the cylindrical battery cell in the divided state and the reference electrode in an electrolytic solution contained in a tray and measuring the potential of the first one of the electrode terminals that is connected to the working electrode connection unit.

That is, the electrode potential measurement device may measure the potential of the electrode terminal connected to the working electrode connection unit after the remaining elements of the electrode potential measurement device, excluding a measurement unit, and the cylindrical battery cell are soaked in the electrolytic solution in the state of being connected to the electrode terminals of the cylindrical battery cell and to the reference electrode.

The short-circuit prevention member may be made of a material that does not react with an electrolytic solution, whereby it is possible to prevent the deformation of the short-circuit prevention member or damage to the short-circuit prevention member due to the reaction of the short-circuit prevention member with the electrolytic solution. Consequently, it is possible to more stably maintain the state of isolation between the top cap assembly and the battery case.

BRIEF DESCRIPTION OF DRAWINGS

FIG. 1 is a schematic view showing the structure of a cylindrical battery cell;

FIG. 2 is a schematic view showing the structure of an electrode assembly constituting the cylindrical battery cell of FIG. 1 before the electrode assembly is wound;

FIG. 3 is a schematic view showing the structure of a three-electrode-system-type electrode potential measurement device for measuring the electrode potential of the cylindrical battery cell of FIG. 1;

FIG. 4 is a schematic view showing the structure of a three-electrode-system-type electrode potential measurement device according to an embodiment of the present invention;

FIG. 5 is a schematic view showing the structure of a short-circuit prevention member of FIG. 4; and FIG. 6 is a schematic view showing an electrode potential measurement method using the electrode potential measurement device of FIG. 4.

BEST MODE

Now, exemplary embodiments of the present invention will be described in detail with reference to the accompanying drawings. It should be noted, however, that the scope of the present invention is not limited by the illustrated embodiments.

FIG. 4 is a schematic view showing the structure of a three-electrode-system-type electrode potential measurement device according to an embodiment of the present invention. Referring to FIG. 4, the three-electrode-system-type electrode potential measurement device, which is denoted by reference numeral 500, is connected to a cylindrical battery cell 400.

In the cylindrical battery cell 400, a beading portion, which is disposed between a top cap assembly 440 and a battery case 430, is divided, and an electrode assembly 420 is mounted in the battery case 430.

The electrode assembly 420 is connected to the top cap assembly 440 and the battery case 430 via a positive electrode tab 421a and a negative electrode tab 422a, respectively. As a result, a positive electrode terminal 421b is located at the top cap assembly 440, and a negative electrode terminal 422b is located at the battery case 430.

The electrode potential measurement device 500 includes a working electrode connection unit 510, a counter electrode connection unit 520, a reference electrode connection unit 530, a measurement unit 540, and a short-circuit prevention member 550.

The working electrode connection unit 510 is connected to the positive electrode terminal 421b of the cylindrical battery cell 400 in order to measure the electrode potential of the positive electrode terminal 421b, and the counter electrode connection unit 520 is connected to the negative electrode terminal 422b of the cylindrical battery cell 400.

The reference electrode connection unit 530 is connected to a reference electrode, which forms a battery circuit for electrode potential measurement, in order to measure the relative value of the potential of the positive electrode terminal 421b, which is connected to the working electrode connection unit 510.

The measurement unit 540 is connected to the working electrode connection unit 510, the counter electrode connection unit 520, and the reference electrode connection unit 530 in order to measure the potential of the electrode terminal connected to the working electrode connection unit 510.

The short-circuit prevention member 550, which prevents the occurrence of a short circuit due to contact between the top cap assembly 440 and the battery case 430 of the cylindrical battery cell 400, is interposed between the top cap assembly 440 and the battery case 430, between which the beading portion is divided.

As a result, the upper surface and the lower surface of the short-circuit prevention member 550 contact the end of the top cap assembly 440 and the end of the battery case 430, respectively, such that the top cap assembly 440 and the battery case 430 are isolated from each other. In the case in which a three-electrode system for electrode potential measurement is constituted, therefore, it is possible to prevent direct contact between the top cap assembly 440 and the battery case 430 of the cylindrical battery cell 400, whereby it is possible to effectively prevent the occurrence of a short circuit in the cylindrical battery cell.

FIG. 5 is a schematic view showing the structure of the short-circuit prevention member of FIG. 4.

Referring to FIG. 5 together with FIG. 4, the short-circuit prevention member 550 is configured to have a discontinuous circular structure that is open in a one-direction portion thereof when viewed in a plan view.

The short-circuit prevention member 550 includes an electrode tab through-hole 551 and an electrode tab insertion part 552.

The electrode tab through-hole 551 is formed through the central portion of the short-circuit prevention member 550 when viewed in a plan view such that the positive electrode tab 421a, which electrically connects the electrode assembly 420 and the top cap assembly 440 to each other, is located in the electrode tab through-hole 551.

The diameter W2 of the electrode tab through-hole 551 is about 35% of the diameter W1 of the short-circuit prevention member 550.

The electrode tab insertion part 552 is formed in a discontinuous portion of the short-circuit prevention member such that the positive electrode tab 421a is inserted into the electrode tab through-hole 551 through the electrode tab insertion part 552 and is then located in the electrode tab through-hole 551. The electrode tab insertion part 552 is configured to have a structure in which the width W3 of the electrode tab insertion part 552 gradually increases from the inside to the outside thereof.

Consequently, the positive electrode tab 421a is easily inserted into the electrode tab through-hole 551 through the electrode tab insertion part 552, whereas it is difficult for the positive electrode tab 421a to be separated from the electrode tab through-hole 551 through the electrode tab insertion part 552, whereby it is possible to maintain the state in which the positive electrode tab 421a is stably fixed.

A first location groove 553 and a second location groove 554, each of which is recessed inwards, are formed respectively in the upper surface and the lower surface of the short-circuit prevention member, which contact the top cap assembly 440 and the battery case 430, respectively, such that the ends of the top cap assembly 440 and the battery case 430, which are separated from each other, are located in the first location groove 553 and the second location groove 554, respectively.

The depth H1 of the first location groove 553 and the depth H2 of the second location groove 554 are the same, and the sum of the depths H1 and H2 of the first location groove 553 and the second location groove 554 is about 26% of the thickness H3 of the short-circuit prevention member 550.

FIG. 6 is a schematic view showing an electrode potential measurement method using the electrode potential measurement device of FIG. 4.

Referring to FIG. 6, the working electrode connection unit 510 and the counter electrode connection unit 520 of the electrode potential measurement device are connected to the positive electrode terminal 421b and the negative electrode terminal 422b of the battery cell 400, respectively, and the reference electrode connection unit 530 is connected to the reference electrode 501, whereby a battery circuit for electrode potential measurement is formed.

A tray 610 is sealed in the state in which an electrolytic solution 620 is contained in the tray. In the state in which the working electrode connection unit 510, the counter electrode connection unit 520, and the reference electrode connection unit 530 of the electrode potential measurement device 500, the battery cell 400, and the reference electrode 501, excluding the measurement unit 540 of the electrode potential measurement device 500, are soaked in the electrolytic solution 620, the electrode potential of the positive electrode terminal 421b of the battery cell 400, which is connected to the working electrode connection unit 510, is measured.

Hereinafter, the present invention will be described in more detail with reference to the following example; however, the scope of the present invention is not limited by the example.

Manufacture of Battery

An electrode assembly, configured to have a structure in which a long sheet type positive electrode and a long sheet type negative electrode are wound in one direction in the state in which the positive electrode and the negative electrode are stacked such that a separator sheet is interposed between the positive electrode and the negative electrode, was inserted into a cylindrical battery case, the electrode assembly was impregnated with an electrolytic solution, and a top cap assembly was coupled to the battery case in order to seal the battery case, whereby a cylindrical battery cell was manufactured.

Example 1

A beading portion of the cylindrical battery cell was cut in order to separate the top cap assembly and the battery case from each other, a working electrode connection unit and a counter electrode connection unit of an electrode potential measurement device were connected to electrode terminals of the top cap assembly and the battery case in the state in which a short-circuit prevention member was interposed between the top cap assembly and the battery case, and a reference electrode connection unit was connected to a lithium thin film, which serves as a reference electrode, whereby a three-electrode system for electrode potential measurement as shown in FIG. 4 was constituted.

Comparative Example 1

A beading portion of the cylindrical battery cell was cut in order to separate the top cap assembly and the battery case from each other, a working electrode connection unit and a counter electrode connection unit of an electrode potential measurement device were connected to electrode terminals of the top cap assembly and the battery case, and a reference electrode connection unit was connected to a lithium thin film, which serves as a reference electrode, whereby a three-electrode system for electrode potential measurement as shown in FIG. 1 was constituted.

Experimental Example 1

The electrode potential of a positive electrode terminal of the battery cell was measured in the state in which the remaining elements of the three-electrode-system-type electrode potential measurement device constituted according to each of Example 1 and Comparative Example 1, excluding a measurement unit of the electrode potential measurement device, and the battery cell were soaked in an electrolytic solution contained in a tray. The measurement was performed on ten (10) three-electrode systems according to each of Example 1 and Comparative Example 1. The number of systems in which a short circuit occurred due to contact between the top cap assembly and the battery case is shown in Table 1.

TABLE 1

| | Number of systems in which short circuit occurred (EA) |
|---|---|
| Example 1 | 0 |
| Comparative Example 1 | 4 |

Referring to Table 1, it can be seen that, in the three-electrode system according to Example 1, in which the short-circuit prevention member was interposed between the top cap assembly and the battery case in order to isolate the top cap assembly and the battery case from each other, the number of systems in which a short circuit occurred was smaller than in the three-electrode system according to Comparative Example 1, in which no short-circuit prevention member was included.

This means that the short-circuit prevention member, interposed between the top cap assembly and the battery case, prevents direct contact between the top cap assembly and the battery case in order to stably maintain the state in which the top cap assembly and the battery case are isolated from each other, whereby it is possible to prevent the occurrence of problems which may be caused by a short circuit in the battery cell at the time of electrode potential measurement.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As is apparent from the above description, the electrode potential measurement device according to the present invention includes a short-circuit prevention member located between a top cap assembly and a battery case, between which a beading portion is divided, in the state of being in contact with the top cap assembly and the battery case. Consequently, it is possible to prevent the occurrence of a short circuit in a battery cell due to direct contact between the top cap assembly and the battery, at which electrode terminals having different polarities are located, and to prevent a reduction in the properties or performance of an electrode assembly due to the same, whereby it is possible to more accurately measure the electrode potential of the battery cell and thus to improve the reliability of measurement. At the same time, it is possible to effectively prevent a reduction in the safety of a worker due to flames or scattering objects generated when a short circuit occurs in the battery cell, and it is also possible to reduce time and expense incurred to separate the top cap assembly and the battery case from each other and to fix the top cap assembly and the battery case, since the electrode potential of the battery cell can be reliably measured in the state in which only the short-circuit prevention member is interposed between the top cap assembly and the battery case.

The invention claimed is:

1. A three-electrode-system-type electrode potential measurement device for measuring an electrode potential of a cylindrical battery cell in a state in which a beading portion is in a divided condition, the beading portion being provided between a top cap assembly and a battery case, a first electrode terminal of the cylindrical battery cell being located at the top cap assembly, and a second electrode terminal of the cylindrical battery cell being located at the battery case, the electrode potential measurement device comprising:
a working electrode connection unit connected to a first one of the first electrode terminal or the second electrode terminal for measuring an electrode potential of the first electrode terminal or the second electrode terminal;
a counter electrode connection unit connected to a remaining one of the first electrode terminal or the second electrode terminal that is not connected to the working electrode connection unit;
a reference electrode connection unit connected to a reference electrode, the reference electrode connection unit, the working electrode connection unit, and the counter electrode connection unit together forming a battery circuit for electrode potential measurement, for measuring a relative value of a potential of the first one of the first electrode terminal or the second electrode terminal connected to the working electrode connection unit;
a measurement unit connected to the working electrode connection unit, the counter electrode connection unit, and the reference electrode connection unit, the measurement unit being configured to measure the potential of the first one of the first electrode terminal or the second electrode terminal connected to the working electrode connection unit; and
a short-circuit prevention member located between the top cap assembly and the battery case, between which the beading portion is divided, the short-circuit prevention member disposed in a state of being in contact with the top cap assembly and the battery case for preventing occurrence of a short circuit due to contact between the top cap assembly and the battery case of the cylindrical battery cell.

2. The electrode potential measurement device according to claim 1, wherein
an electrode assembly is mounted in the battery case in a state of being impregnated with an electrolytic solution, and
the top cap assembly and the battery case are electrically connected to a first electrode and a second electrode of the electrode assembly, respectively, via a first electrode tab and a second electrode tab, respectively, in order to form the first electrode terminal and the second electrode terminal, respectively.

3. The electrode potential measurement device according to claim 1, wherein the short-circuit prevention member is made of a material that does not react with an electrolytic solution.

4. The electrode potential measurement device according to claim 3, wherein the short-circuit prevention member is made of a Teflon material.

5. The electrode potential measurement device according to claim 1, wherein the short-circuit prevention member is configured to have a discontinuous circular structure when viewed in a plan view.

6. The electrode potential measurement device according to claim 5, wherein a diameter of the short-circuit prevention member is 110% to 150% of a diameter of each of the top cap assembly and the battery case when viewed in a horizontal sectional view.

7. The electrode potential measurement device according to claim 5, wherein a thickness of the short-circuit prevention member is 50% to 150% of a height of the top cap assembly.

8. The electrode potential measurement device according to claim 5, wherein the short-circuit prevention member comprises:
an electrode tab through-hole formed through a central portion of the short-circuit prevention member when viewed in the plan view, such that a first electrode tab for electrically connecting the electrode assembly and the top cap assembly to each other is located in the electrode tab through-hole; and
an electrode tab insertion part formed in a discontinuous portion of the short-circuit prevention member, the electrode tab insertion part being configured to receive the first electrode tab therethrough during assembly of the first electrode tab into the electrode tab through-hole.

9. The electrode potential measurement device according to claim 8, wherein a diameter of the electrode tab through-hole is 10% to 90% of a diameter of the short-circuit prevention member.

10. The electrode potential measurement device according to claim 8, wherein a width of the electrode tab insertion part is 10% to 50% of a width of the short-circuit prevention member when viewed in a plan view.

11. The electrode potential measurement device according to claim 1, wherein the short-circuit prevention member defines a first location groove and a second location groove, each of which is recessed inwards relative to respective first and second opposite surfaces of the short-circuit prevention member, the first and second surfaces contacting the top cap assembly and the battery case, respectively, such that ends of the top cap assembly and the battery case are located in the first location groove and the second location groove, respectively.

12. The electrode potential measurement device according to claim 11, wherein a sum of depths of the first location groove and the second location groove is 10% to 90% of a thickness of the short-circuit prevention member.

13. The electrode potential measurement device according to claim 11, wherein the first location groove and the second location groove have a same depth or different depths.

14. A method of measuring an electrode potential of a cylindrical battery cell using an electrode potential measurement device, the method comprising:

a) cutting a beading portion of the cylindrical battery cell in order to separate a top cap assembly and a battery case of the cylindrical battery cell from each other, thereby causing the cylindrical battery cell to be in a divided state;

b) locating a short-circuit prevention member between the top cap assembly and the battery case in order to prevent occurrence of a short circuit by preventing contact between the top cap assembly and the battery case;

c) connecting a working electrode connection unit of the electrode potential measurement device to a first one of a first electrode terminal located at the top cap assembly or a second electrode terminal located at the battery case, in order to measure a potential of the first one of the electrode terminals that is connected to the working electrode connection unit;

d) connecting a counter electrode connection unit of the electrode potential measurement device to a remaining one of the first electrode terminal or the second electrode terminal that is not connected to the working electrode connection unit;

e) connecting a reference electrode connection unit of the electrode potential measurement device to a reference electrode; and f) soaking the cylindrical battery cell in the divided state and the reference electrode in an electrolytic solution contained in a tray and measuring the potential of the first one of the electrode terminals that is connected to the working electrode connection unit.

* * * * *